US007054206B2

(12) United States Patent
Tellier

(10) Patent No.: US 7,054,206 B2
(45) Date of Patent: May 30, 2006

(54) SUB-COLUMN-REPAIR-CIRCUIT

(75) Inventor: Yanni Tellier, Mougins (FR)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 10/853,855

(22) Filed: May 26, 2004

(65) Prior Publication Data
US 2004/0240283 A1    Dec. 2, 2004

(30) Foreign Application Priority Data
May 28, 2003 (EP) ................................. 03291292

(51) Int. Cl.
*G11C 7/00* (2006.01)
(52) U.S. Cl. ...................... 365/200; 365/201
(58) Field of Classification Search ................ 365/200, 365/201, 230.02
See application file for complete search history.

(56) References Cited

U.S. PATENT DOCUMENTS

| | | | |
|---|---|---|---|
| 5,301,153 A | | 4/1994 | Johnson |
| 5,910,921 A | * | 6/1999 | Beffa et al. .................. 365/201 |
| 6,151,263 A | | 11/2000 | Kyung et al. |
| 6,295,237 B1 | * | 9/2001 | Pochmuller ................ 365/201 |
| 6,490,208 B1 | * | 12/2002 | Yoon .......................... 365/200 |
| 2005/0018517 A1 | * | 1/2005 | Collura et al. ........... 365/225.7 |

\* cited by examiner

*Primary Examiner*—Anh Phung
*Assistant Examiner*—Hien Nguyen
(74) *Attorney, Agent, or Firm*—Maginot, Moore & Beck

(57) ABSTRACT

An arrangement for repairing at least one faulty bit line of a memory includes three multiplexer stages. The memory has a plurality of columns, each column having k memory subcolumns. Each memory subcolumn has n bit lines. The first multiplexer stage has k multiplexers, each multiplexer having a multiplexer output and n multiplexer inputs connected to n bitlines of a memory subcolumn. The multiplexers of the first multiplexer stage are switched in response to a first address decoding signal. The second multiplexer stage has k multiplexers, each second stage multiplexer having a first multiplexer input connected to a multiplexer output of a first stage multiplexer associated with a first memory subcolumn, a second multiplexer input connected to a multiplexer output of a first stage multiplexer associated with a second memory subcolumn, and a multiplexer output. The multiplexers of the second multiplexer stage are switched in response to a fuse data signal. The third multiplexer stage includes at least one multiplexer having k multiplexer inputs connected to the multiplexer outputs of the multiplexers of the second multiplexer stage and one multiplexer output operably connected to a data bus of the memory. The multiplexer of the third multiplexer stage is switched in response to a second address decoding signal.

20 Claims, 12 Drawing Sheets

SUB-COLUMN-REPAIR-CIRCUIT

BACKGROUND OF THE INVENTION

Semiconductor memories are binary data memories in which a plurality of memory cells are provided. The memory cells are addressable by means of wordlines and bitlines. The main memory comprises a matrix of many memory cells connected to address decoding means and sense amplifiers. Addressing a memory cell, i.e. the selection of a memory cell, is performed by activating wordlines which are connected to address decoding means. The data stored in the addressed memory cells are read out by input/output units having sense amplifiers for amplifying the read-out data signal. The input/output units are connected to a data bus by means of which data can be read out from the memory or written into the memory.

When a random access memory is produced, it can happen that some of the memory cells within the matrix are faulty. Accordingly, the produced memory chip is tested, and it is decided whether it can be repaired. For this purpose, there is normally provided an on-chip circuitry to provide testing of the memory chip. The built-in self-test (BIST) is essentially the implementation of logic built into the memory chip to do testing without the use of a tester for data pattern generation on comparison purposes.

FIG. 1 shows the architecture of a memory chip according to the state of the art. The memory chip comprises a main memory with a plurality of memory cells and a redundancy logic having a built-in self-test device. The memory chip is connected to an address bus, a control bus and a data bus. In a test mode, the addresses of the faulty memory cells are detected. The redundancy logic replaces the faulty memory cells within the main memory with memory cells in the form of redundant registers within the redundancy logic. For this purpose the redundancy logic programs fuses within a fusebox. The address applied to the address bus is compared with the addresses of the detected faulty memory cells, and when there is a match, the redundancy logic maps the faulty address to an address of a register cell within the redundancy logic to replace the faulty memory cell. When reading data from the memory chip, the redundancy logic controls a multiplexer connected to the data bus. When accessing data with an address of a faulty memory cell, the data is read from the register replacing the memory cell within the redundancy logic.

FIG. 2 shows the architecture of a main memory within the memory chip according to the state of the art. In this example, the main memory is a 8k×16 wide memory having 16 input/output units and wordline address decoders (XDEC) for decoding the wordline address or X-address of the memory cells. The input/output units are connected to the memory cell matrix by means of vertical bitlines. The input/output units receive the bitline address or Y-address of the selected memory cell.

The main memory shown in FIG. 2 according to the state of the art is partitioned in two memory halves wherein the X-address decoders are placed in the center. With this architecture, the length of the wordlines is comparatively short so that the parasitic capacitance of the wordlines can be minimized. Each input/output unit is connected to the 16 bitlines for reading data from the addressed memory cell and for writing data into an addressed memory cell.

FIG. 3 shows the architecture of an input/output unit according to the state of the art. For reading out data, the input/output unit comprises multiplexer which are connected to the bitlines of the memory cell matrix. In the shown example, each memory cell is connected to a multiplexer via a couple or pair of bitlines BL, $\overline{BL}$ to provide a differential signal to the input of the multiplexer. In the shown example, each multiplexer has N signal inputs. On the output side, each multiplexer is connected to a differential amplifier and an inverter for amplifying the read-out data signal and to supply the data to a data bus. The multiplexers are controlled by the applied Y-address. Each input output unit (IO) comprises a column decoder and a read/write amplifier.

In a conventional memory, there are provided either redundant registers, redundant bitlines and/or wordlines to repair a memory chip in case that faulty memory cells are detected when testing the memory chip.

If the conventional memory chip comprises redundant registers, the number of faulty addresses is limited by the number of redundant registers provided within the redundancy logic. If there are, for instance, ten redundant registers, it is only possible to repair ten faulty addresses. When an address is "faulty", the address is stored in a redundant register. Since the number of faulty addresses detected by the main memory, it is not known before testing a considerable number of registers have to be provided within the redundancy logic to guarantee the repair of the chip even when a lot of memory cells are detected to be faulty.

In case that the memory chip comprises redundant bitlines BL and/or wordlines WL, the repair method is much more complex, because all errors have to be known in advance before the error pattern can be diagnosed and an optimal repair solution can be calculated. Storing detected memories with a conventional method implies a very large array.

Such an array needs a lot of space on the memory chip, thus increasing costs when producing the memory chip.

In European patent application EP 02022312.9 filed on Oct. 7, 2002 a method for storing detected errors in a separate diagnose array having a minimum storage and a memory chip having a diagnose array with a minimum storage size for storing detected errors of a main memory within the memory chip are described.

As can be seen from FIG. 4, the memory chip as described in EP 02022312.9 comprises a memory with a built-in redundancy. The memory comprises a plurality of memory cells which are addressable by means of wordlines and bitlines. The memory comprises redundant wordlines and redundant bitlines which are provided for repairing faulty memory cells. The memory is connected to a control block, a BIST-unit and a repair unit. The repair unit is connected to programmable fuses which are provided for replacing wordlines by redundant wordlines and input/output units by redundant input/output units within the memory.

The built-in self-test unit performs a test of the memory within the chip and checks whether there are any memory cells which are defective. The diagnose unit consists of a control unit and a diagnose array. The diagnose array is provided for storing logically detected errors within the main memory found by the built-in self-test device in a test mode. The diagnose array stores in a logical manner the errors found in the memory. The control unit controls the storing of detected errors into the diagnose array and analyzes the stored errors to select wordlines and input/output units within the memory to be replaced by redundant wordlines and redundant input/output units. Depending on the analyzing result, the repair unit programs fuses in a fusebox connected to the main memory. A basis of the data content of the storage table within the diagnose array, the repair unit performs a pre-fuse of the fuses to replace wordlines in the input/output unit of faulty memory cells by redundant wordlines and redundant input/output units. In the next step, the provisionally repaired memory is again tested, and if no further errors are detected, the fuses in the fusebox are blown.

FIG. 5 shows a memory array within a memory chip as shown in FIG. 4. The memory is partitioned in two memory halves A, B, each having a matrix of memory cells. The memory cells are connected to x-address-decoders (XDEC) and to input/output units I/O. The input/output units are connected to data input/output pads of the memory chip. Each input/output unit I/O is for example connected to 16 bitlines of the memory cell array.

As can be seen from FIG. 5, the memory further comprises redundant X-address decoders XDEC and redundant input/output units I/O red. Further, a control and comparator unit is provided connected to the address bus and to the fusebox via control lines.

FIG. 6 shows the architecture of the input/output units I/O in the memory chip as described in EP 02022312.9. As can be seen from FIG. 6, there is provided a redundant input/output unit I/O which may be activated by the programmed fuses. The fusebox is connected via control lines to multiplexers MUX A, B, C within a multiplex stage. The fusebox comprises the information data on the input/output unit I/O to be replaced by the redundant input/output unit I/O. A control signal is supplied to the multiplexer stage to block the input/output I/O which is connected to a faulty memory cell within the memory and which is decided to be replaced from the corresponding data pad The redundant input/output unit I/OR is connected to data pad C as a substitute. The redundant input/output unit I/OR is activated by the fuses. Providing the additional multiplexer stage has almost no impact on the signal delay.

As shown in FIG. 6 the memory chip comprises a memory cell array with several memory columns. Each column comprises eight to sixteen bitlines BL which are connected to a two stage multiplexer unit. FIG. 7 shows the structure of a two stage multiplexer unit in more detail. The memory column comprising for instance 16 bitlines BL is connected to the first stage of multiplexers each having four inputs. The output terminals of the multiplexers are connected to a further multiplexer having four inputs and one output. The four multiplexers of the first stage are controlled by a predecoding signal switching one of the four inputs to the second multiplexer stage in response to a predecoding control signal generated by a column decoder. The multiplexer of the second stage of the two stage multiplexer unit is controlled by a postdecoding control signal generated by the column decoder. The first stage of the two stage multiplexer unit comprises four multiplexers which preselect the data coming from the memory cells. The second stage of the multiplexer unit is provided for postdecoding having another multiplexer including a latch for the output data.

The predecoding and postdecoding signal is generated by the column decoder on the basis on an applied y-address. To this end the column decoder is connected to the address bus and receives the y-address.

The output of the two stage multiplexer unit is connected to sense amplifier for amplifying the bitline signal. The amplified signal is applied to a first input of a multiplexer which is provided for shifting a complete memory column having sixteen bitlines to another data output in case that it is detected that one memory column has at least one faulty bitline.

The shift stage comprises several multiplexers each having two inputs and one output. The multiplexers of the shift stage are controlled by a fuse data signal applied from a fuse box including programmable fuses. If it is detected that the memory column comprises at least one bitline which is faulty the fuses within the fuse box are programmed or blown to repair the memory cell array.

For example if it is detected that the memory column B as shown in FIG. 7 comprises a faulty bitline the output of the multiplexer unit B is blocked from the output data pad B by switching the multiplexer A of the shift stage to the first input being connected to the multiplexer unit A and switching multiplexer B of the shift stage to the output of the multiplexer unit C belonging to the adjacent memory column C. The memory column A is then switched to the next adjacent memory column and so on until a redundant memory column provided within the memory cell array is reached.

A disadvantage of the structure as shown in FIG. 7 is that only one bitline BL within a memory column is detected a complete memory column is blocked and shifted to the output data path of the adjacent memory column. According to repair only one bitline failure it is accordingly necessary to provide a complete redundant memory column which comprises sixteen bitlines. The provision of a redundant memory column having sixteen bitlines occupies a lot of area on the chip thus increasing production costs.

Accordingly it is the object of the invention to provide a repair circuit which needs a minimum area on the chip but which nevertheless repairs bitline failure reliably.

SUMMARY

This object is achieved by embodiments of the invention.

The invention provides a Sub-Column-Repair-Circuit connected to a memory column of a memory for repairing at least one faulty bitline (BL) within a memory sub-column of said memory column, wherein each memory column comprises k memory sub-columns each having n bitlines, wherein the column-repair-circuit comprises:

a first multiplexer stage which includes k multiplexers each multiplexer having n multiplexer inputs connected to n bitlines (BL) of a memory sub-column and a multiplexer output, wherein the multiplexers of the first multiplexer stage are switched in response to a predecoding signal;

a second multiplexer stage which includes k multiplexers, each multiplexer of the second multiplexer stage having a first multiplexer input connected to an multiplexer output of a multiplexer of the first multiplexer stage belonging to a first memory sub-column, a second multiplexer input connected to an multiplexer output of a multiplexer of the first multiplexer stage belonging to a second memory sub-column which is arranged adjacent to the first memory sub-column, and a multiplexer output, wherein the multiplexers of the second multiplexer stage are switched in response to a fuse data signal for replacing a faulty memory sub-column by an adjacent memory sub-column;

a third multiplexer stage including at least one multiplexer having k multiplexer inputs connected to the multiplexer outputs of the multiplexers of the second multiplexer stage and one multiplexer output connected to a data pad of the memory, wherein the multiplexer of the third multiplexer stage is switched in response to a postdecoding signal.

The core idea of the invention is to perform the shifting or reparation after the first stage of the two stage multiplexer unit instead of performing the shifting after the second stage of the two stage multiplexer unit as shown in FIG. 7. Consequently only four consecutive bitlines BL are placed by a redundant memory subcolumn instead of eight or sixteen bitlines. This new concept has the great advantages to save chip area for bitline failure replacement.

The yield improvement between four consecutive bitline replacement and sixteen consecutive bitline replacement is not significant. Accordingly it is not necessary to provide such a high redundancy as shown in FIG. 7 but it is sufficient to provide a redundancy of for example four bitlines corresponding to one memory subcolumn.

With the Sub-Column-Repair-Circuit having the features of main claim 1 the data path is only shifted by four core cells instead of sixteen memory cells as shown in the circuit of FIG. 7. This way only a column composed of for example four wordlines is required for bitline redundancy and a lot of memory chip area is saved.

A further advantage of the Sub-Column-Repair-Circuit according to the present invention resides in that it is possible to replace a faulty sense amplifier.

In a preferred embodiment according to the present invention the Column-Repair-Circuit includes a sense amplifier stage which comprises several sense amplifiers.

In a preferred embodiment each sense amplifier amplifies the output signal of a multiplexer of the first multiplexer stage.

In a preferred embodiment the predecoding signal and the postdecoding signal are generated by a column decoder which decodes an applied y-address signal.

In a further preferred embodiment the fused data signal is applied from a fusebox including fuses which are programmable.

In a preferred embodiment of the Column-Repair-Circuit according to the present invention the multiplexer output of the third multiplexer stage is connected to an output data buffer.

In a preferred embodiment the bitlines and the lines connecting the multiplexer stages are differential signals.

The sense amplifiers are differential sense amplifiers in a preferred embodiment.

The invention provides a memory chip comprising a memory cell array with several memory columns each including K memory subcolumns and with at least one redundant memory subcolumn and further a Sub-Column-Repair-Circuit having the features of mainclaim 1.

A preferred embodiment of the method according to the present invention and of the memory-chip according to the present invention is explained with reference to the enclosed figures:

DETAILED DESCRIPTION

Figure 9:
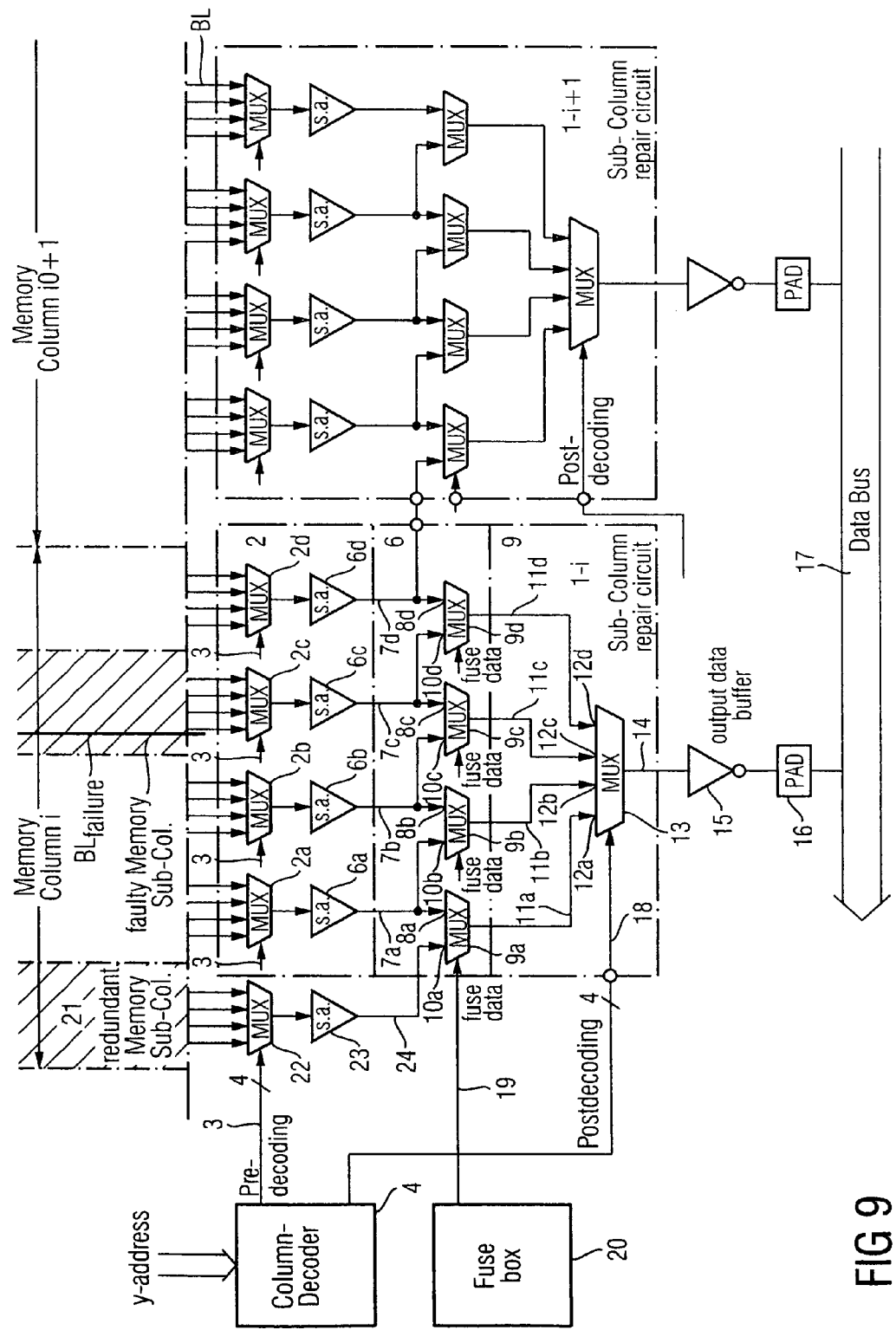
FIG. 9 shows a preferred embodiment of Sub-Column-Repair-Circuit according to the present invention.

FIG. 9 shows a preferred embodiment of the Sub-Column-Repair-Circuit 1 according to the present invention. The memory chip comprises a memory cell array having several memory columns. In FIG. 9 two memory columns i, i+1 are shown. Each memory column comprises sixteen bitlines BL which are connected to a corresponding Sub-Column-Repair-Circuit 1. The memory columns are organized into four memory subcolumns each having four bitlines BL. The memory subcolumn within a memory column is connected to one multiplexer in the first multiplexer stage of the Sub-Column-Repair-Circuit 1.

As can be seen from FIG. 9 the Sub-Column-Repair-Circuit 1 comprises a first multiplexer stage 2 having multiplexers 2a, 2b, 2c, 2d. Each multiplexer 2a, 2b, 2c, 2d is connected to four bitlines BL of a memory subcolumn. A Sub-Column-Repair-Circuit 1 comprises k multiplexers. Each multiplexer has n multiplexer inputs connected to n bitlines BL of a memory subcolumn and one multiplexer output. In the embodiment as shown in FIG. 9 the number of multiplexers in the first stage is four and the number of inputs connected to the bitlines BL is also four. The multiplexers 2a, 2b, 2c, 2c of the first multiplexer stage 2 are switched in response to a predecoding signal applied via control lines 3. The predecoding signal is generated by a column decoder 4 and connected via address signal lines 5 to an address bus. The y-address is supplied to the column decoder 4 which decodes the address signal and generates a predecoding signal and a postdecoding signal. The output terminals of the multiplexers 2a, 2b, 2c, 2d of the first multiplexer stage 2 are connected to corresponding sense amplifiers 6a, 6b, 6c, 6d, within the Sub-Column-Repair-Circuit 1. The sense amplifiers 6a, 6b, 6c, 6d form a sense amplifier stage 6. The number of sense amplifiers corresponds to the number of multiplexers 2a, 2b, 2c, 2d within the first multiplexer stage 2 of the Sub-Column-Repair-Circuit 1. The output terminals of the sense amplifiers 6a, 6b, 6c, 6d are connected via data signal lines 7a, 7b, 7c, 7d to inputs 8a, 8b, 8c, 8d of multiplexers 9a, 9b, 9c, 9d forming a second multiplexer stage 9 within the Sub-Column-Repair-Circuit 1. Each multiplexer 9a, 9b, 9c, 9d comprises a further input 10a, 10b, 10c, 10d connected to the output of the adjacent sense amplifier. The outputs of the multiplexers 9a, 9b, 9c, 9d are connected via datalines 11a, 11b, 11c, 11d to input terminals 12a, 12b, 12c, 12d of a further multiplexer 13 within the Sub-Column-Repair-Circuit 1. The multiplexer 13 forms a third multiplexer stage within the Sub-Column-Repair-Circuit 1. The output terminal of multiplexer 13 is connected via an output data line 14 to a corresponding output data buffer 15 which is formed by an inverter circuit. The output of the inverter circuit 15 is connected to a data pad 16 of the memory chip. The data pad 16 is connected to an external data bus 17.

As can be seen from FIG. 9 the Sub-Column-Repair-Circuit 1 according to the present invention comprises three multiplexer stages, a first multiplexer stage 2, a second multiplexer stage 9 and a third multiplexer stage 13. The first multiplexer stage includes four multiplexers 2a, 2b, 2c, 2d which are controlled by a predecoding control signal generated by the column decoder 4. The single multiplexer 13 of the third multiplexer stage is controlled via a control line 18 in response to a postdecoding control signal which is also generated by the column decoder 4.

The second multiplexer stage 9 is a shift stage which is provided for repairing a memory sub column which includes at least one faulty bitline. The multiplexers 9a, 9b, 9c, 9d of the Sub-Column-Repair-Circuit 1 are controlled by a fuse data signal. The fuse data signal is applied via control lines 19 by fuses within a fusebox 20. The fusebox 20 includes programmable fuses.

The memory cell array is tested by applying data test pattern to find out faulty bitlines. If a bitline failure is detected it is analyzed in which subcolumn of the memory the bitline failure occurs. Fuses within the fusebox 20a are programmed or blown in such a manner that the subcolumn in which the bitline failure has occurred is replaced by a redundant memory subcolumn 21 as shown in FIG. 9. The memory subcolumn 21 comprises the same number of bitlines BL as the remaining memory subcolumns within the memory cell array. The redundant memory subcolumn 21 is connected to a multiplexer 22 having four inputs and one output. At the output side of the multiplexer 22 the sense amplifier 23 is provided for amplifying the data signal of the bitlines of the redundant memory subcolumn 21. The output of the sense amplifier 23 is connected via line 24 to the input 10a of the first multiplexer 9a of the Sub-Column-Repair-Circuit 1.

If for instance as shown in FIG. 9 the third memory subcolumn within memory column i comprises at least one faulty bitline $BL_f$ fuses within the fusebox 20 are programmed in such a manner that the output signal of the multiplexer 2c and of the sense amplifier 6c is blocked from the output data pad 16. To this end the first multiplexer 9a is switched from input 8a to input 10a thus activating the redundant sub memory column 21. Further the input of multiplexer 9b is switched from input 8b to input 10b. The third multiplexer 9c is switched from input 8c to input 10c. Multiplexer 9d keeps input 8d connected to output 11d. In this manner output line 7c is blocked from line 11c by multiplexer 9c and from line 11d by multiplexer 9d. The faulty memory subcolumn connected to multiplexer 2c is blocked from the data bus. In a preferred embodiment the bitlines connecting the memory cell array to the first multiplexer stage and the connecting lines which connects the multiplexer stages 2, the sense amplifier stage 6 and multiplexer stages 9 and 13 are also differential signal lines. In this embodiment the sense amplifiers are differential sense amplifiers.

Figure 1:
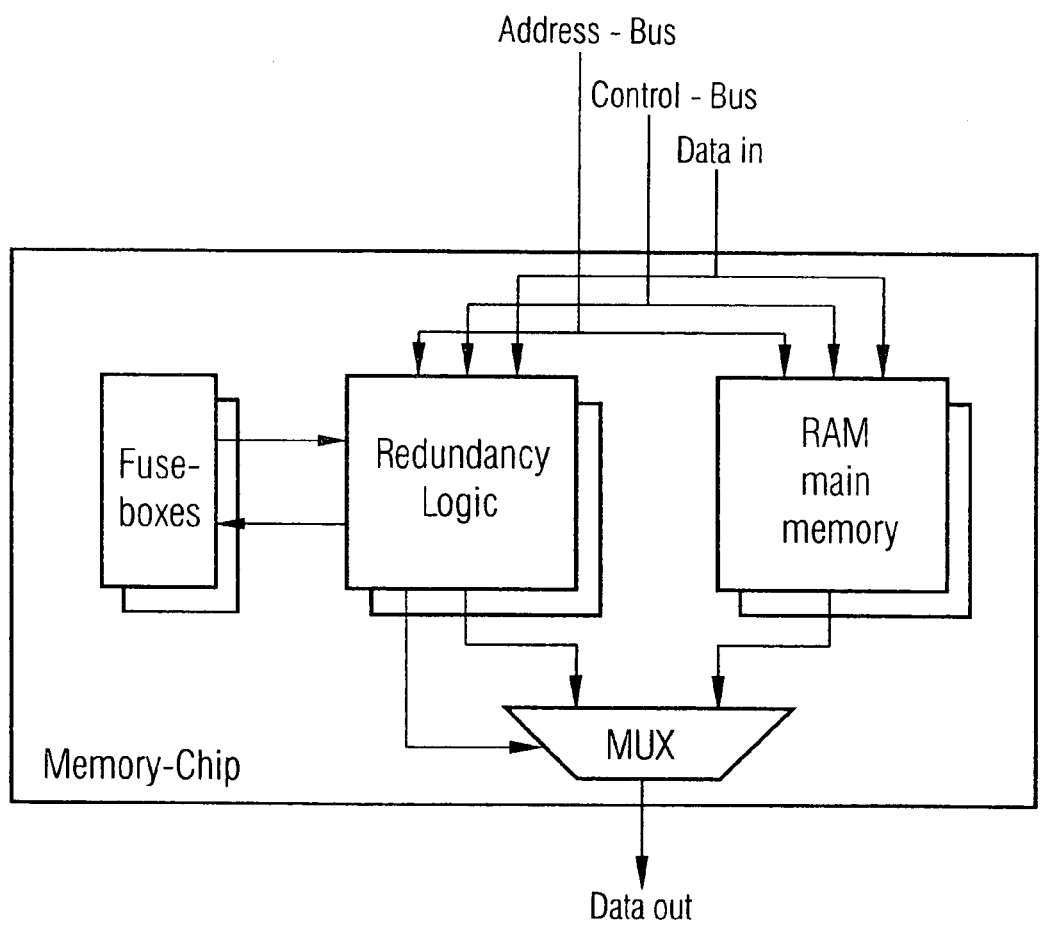
FIG. 1 shows a memory chip with a redundancy logic according to the state of the art.
Figure 2:
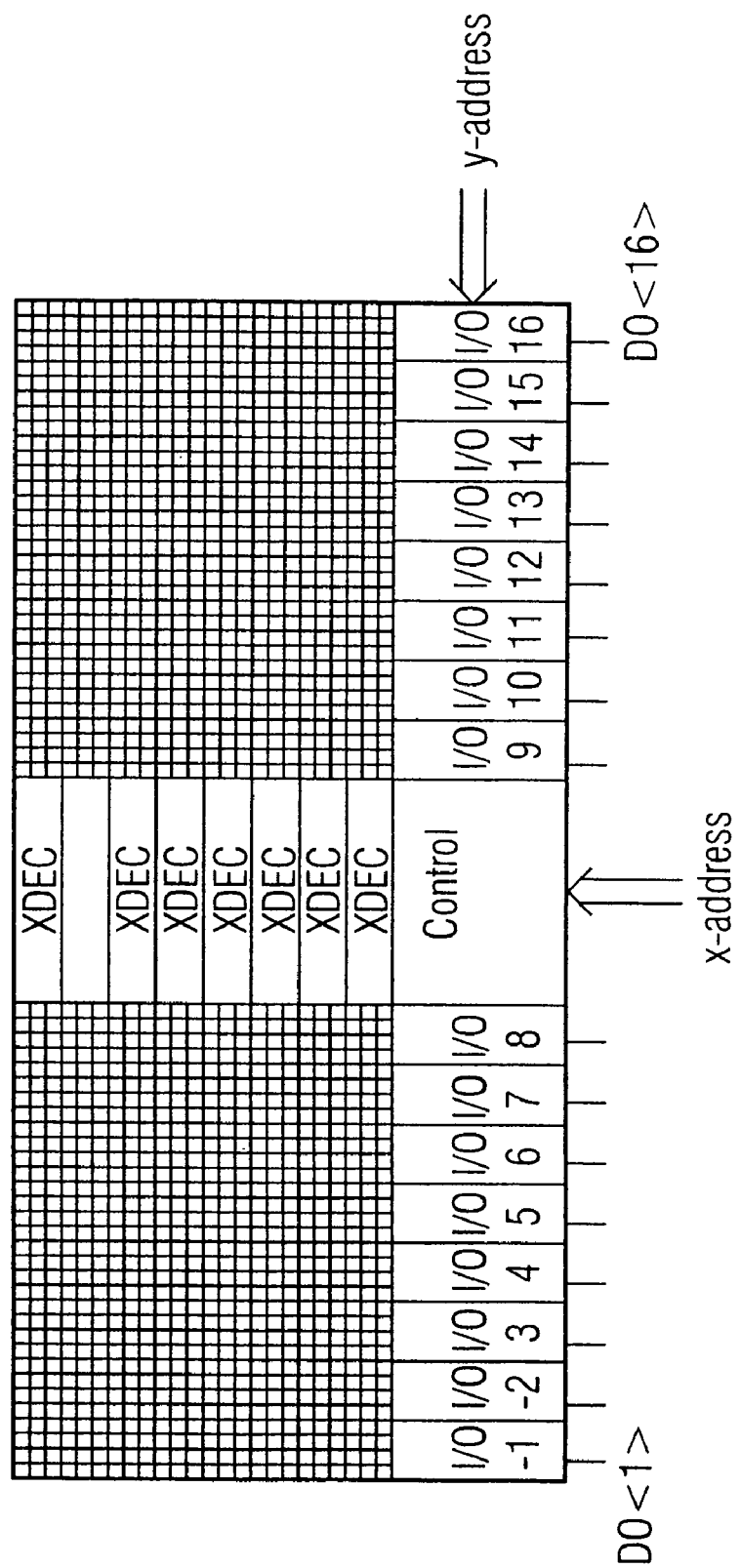
FIG. 2 shows the main memory within a memory chip according to the state of the art.
Figure 3:
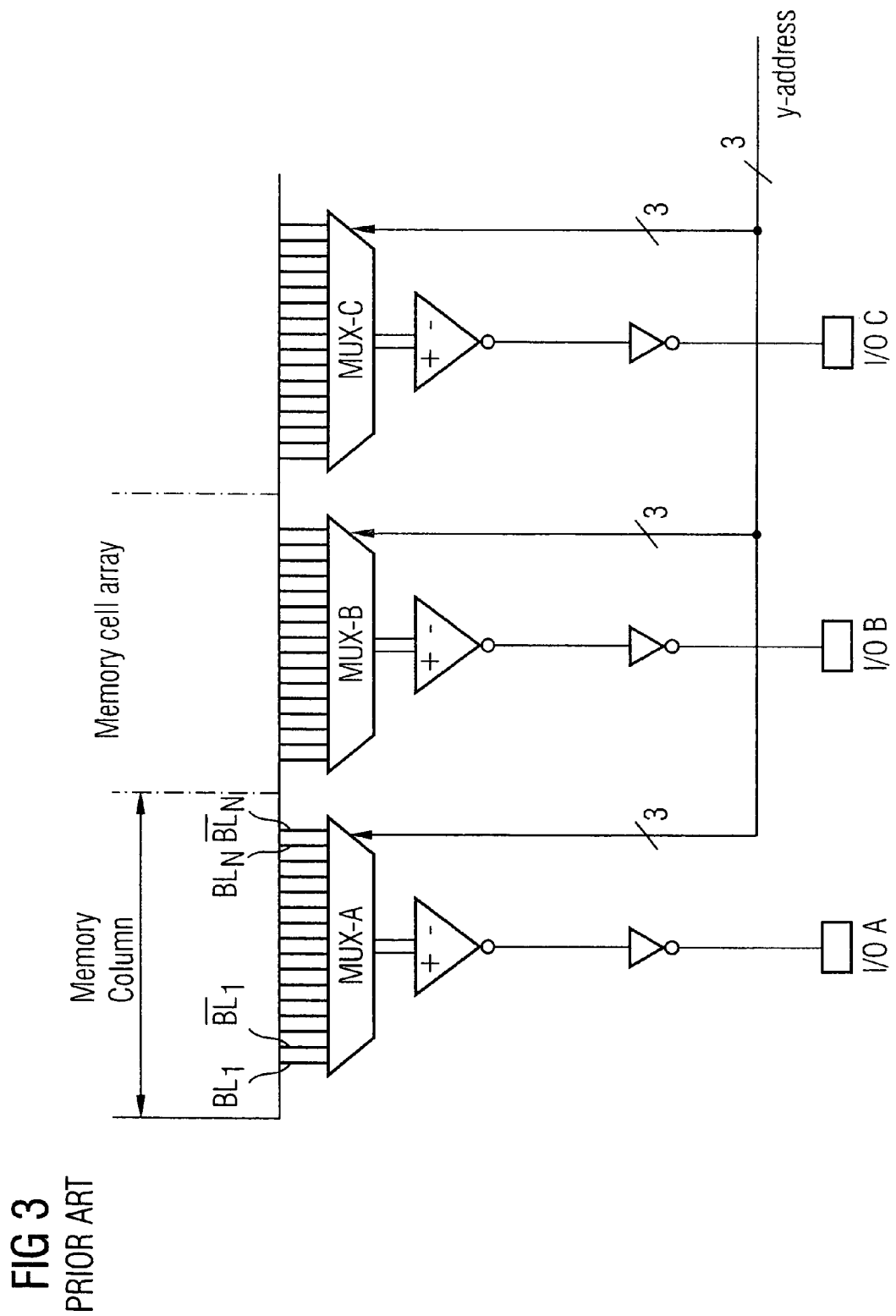
FIG. 3 shows an input/output unit according to the state of the art.
Figure 4:
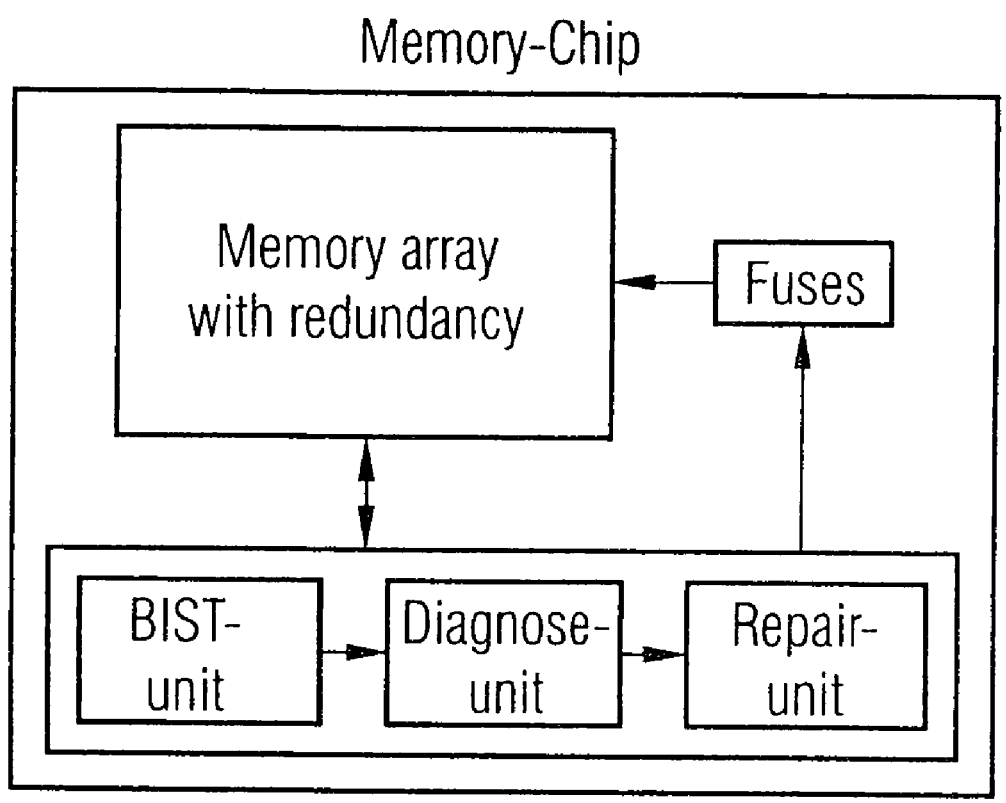
FIG. 4 shows the architecture of a memory chip as described in EP 02022312.
Figure 5:
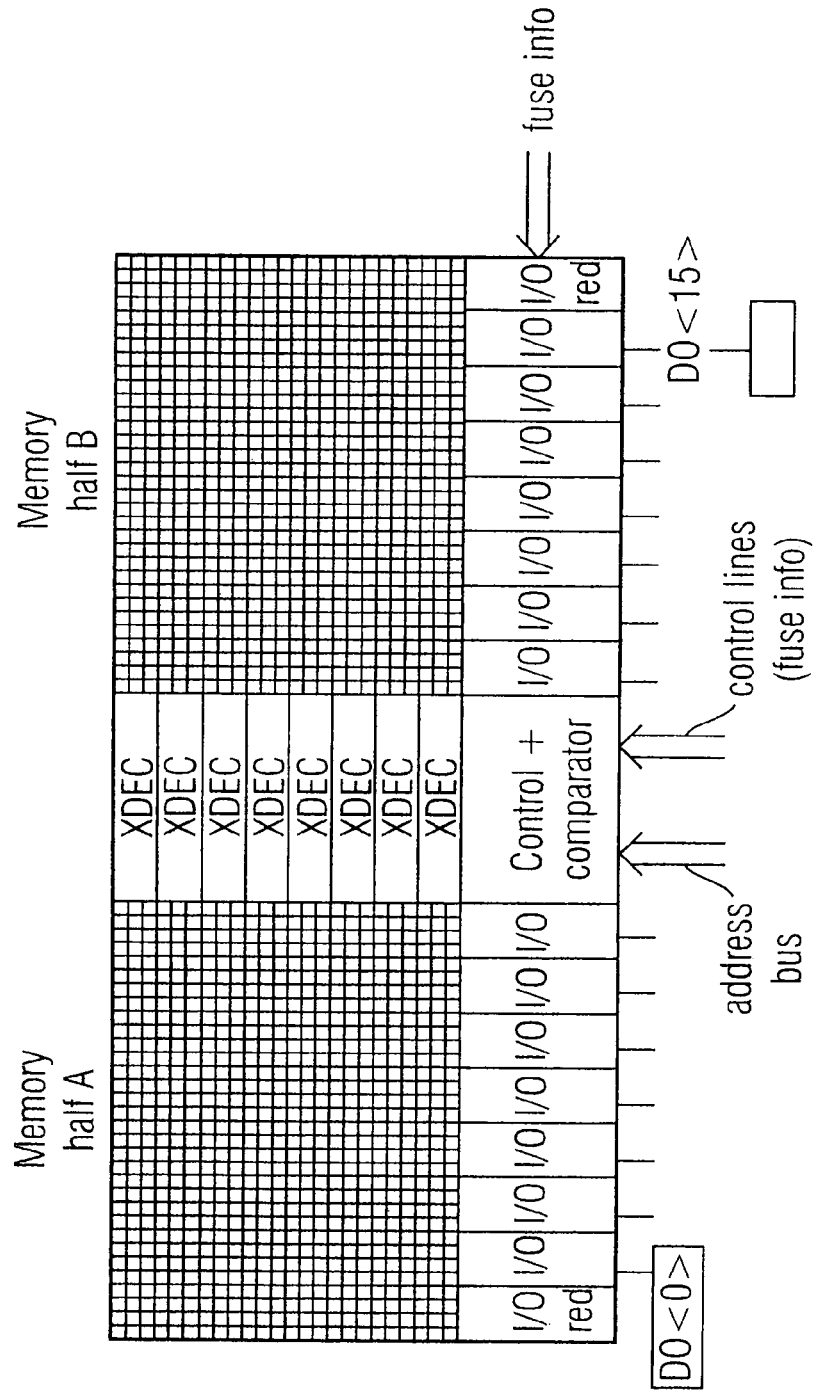
FIG. 5 shows a main memory within a memory chip with a redundancy as described in EP 02022312.
Figure 6:
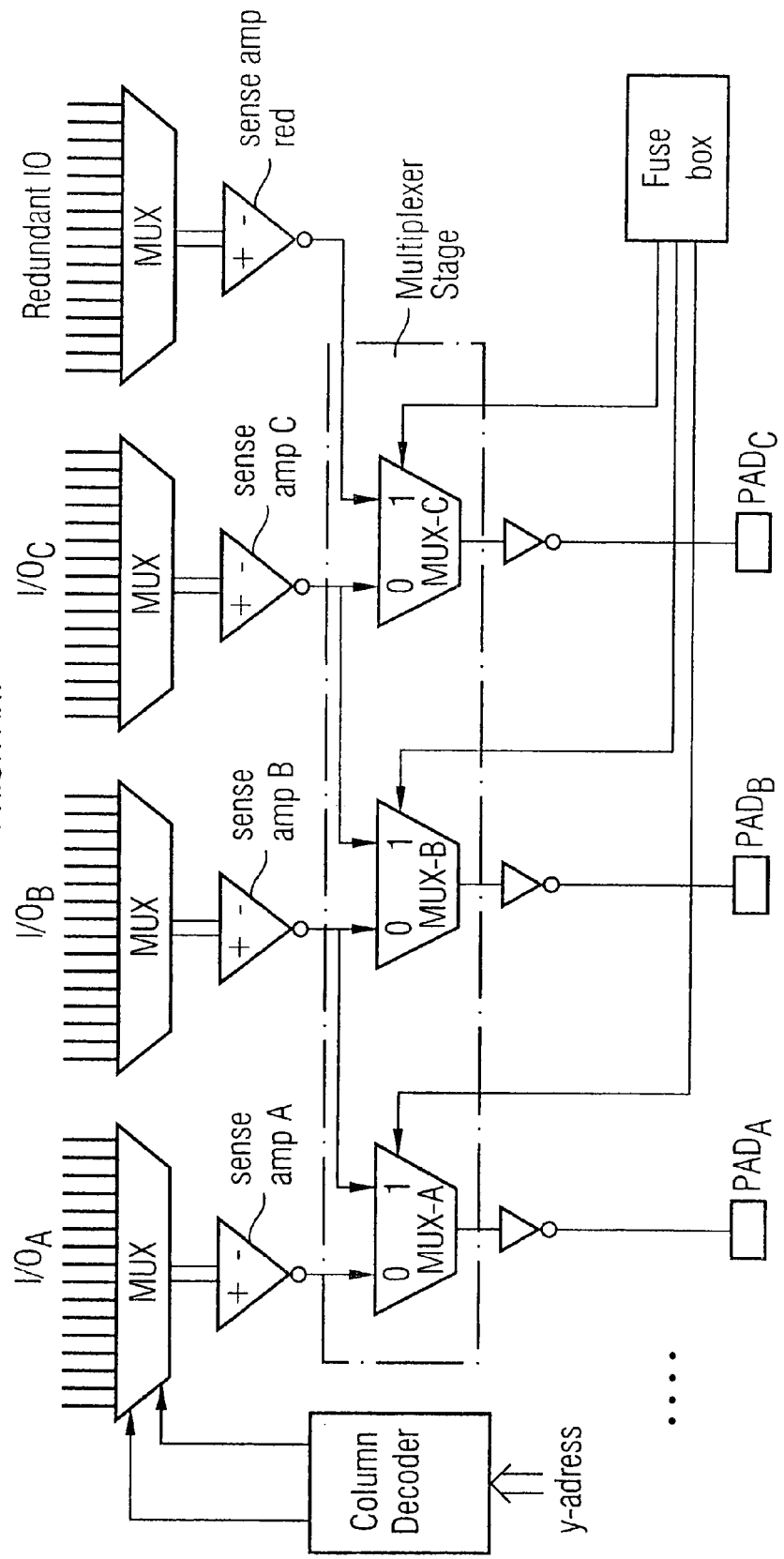
FIG. 6 shows an input/output unit within a memory chip as described in EP 02022312.
Figure 7:
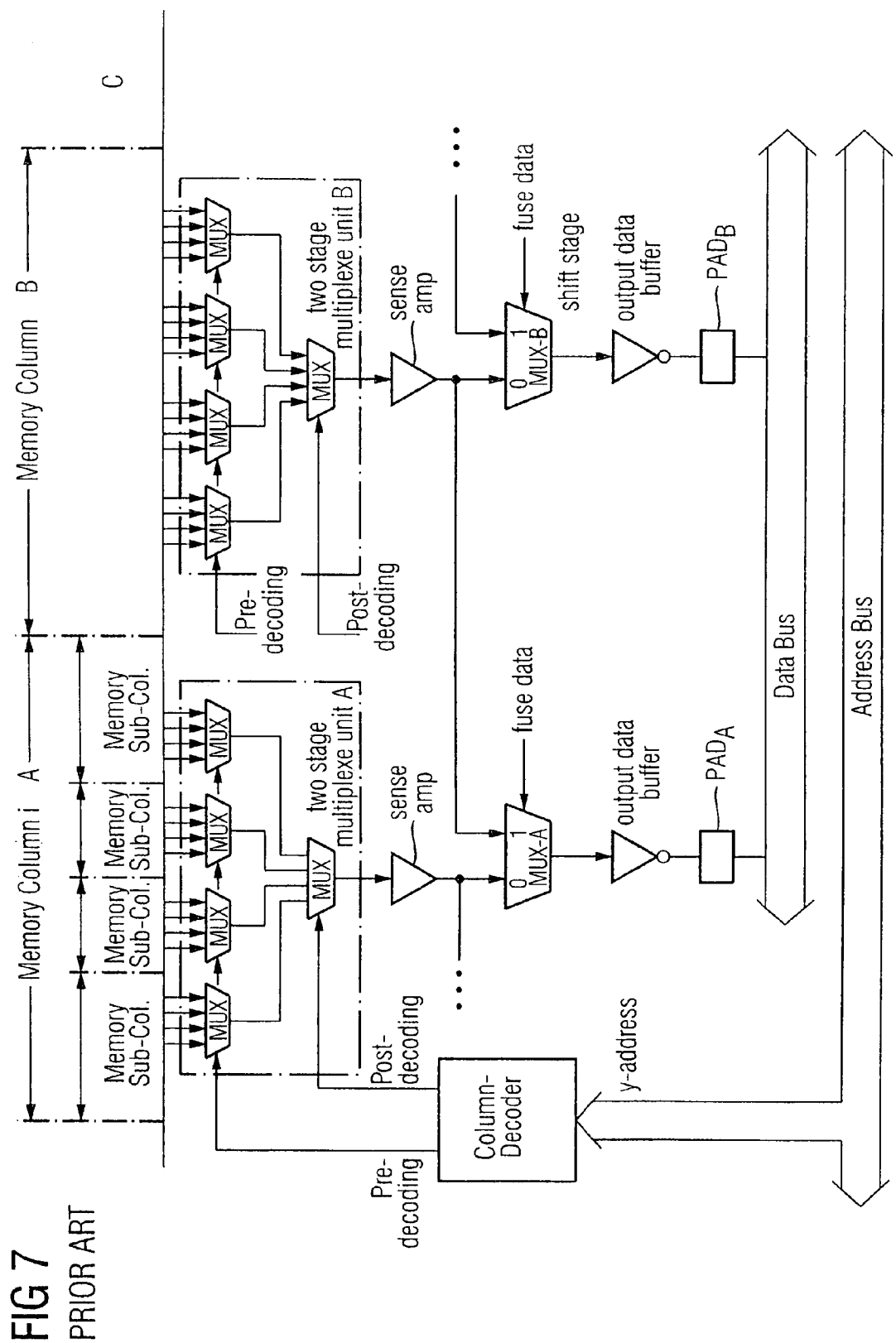
FIG. 7 shows the two stage multiplexer units within an input/output unit of FIG. 6 in more detail.
Figure 8:
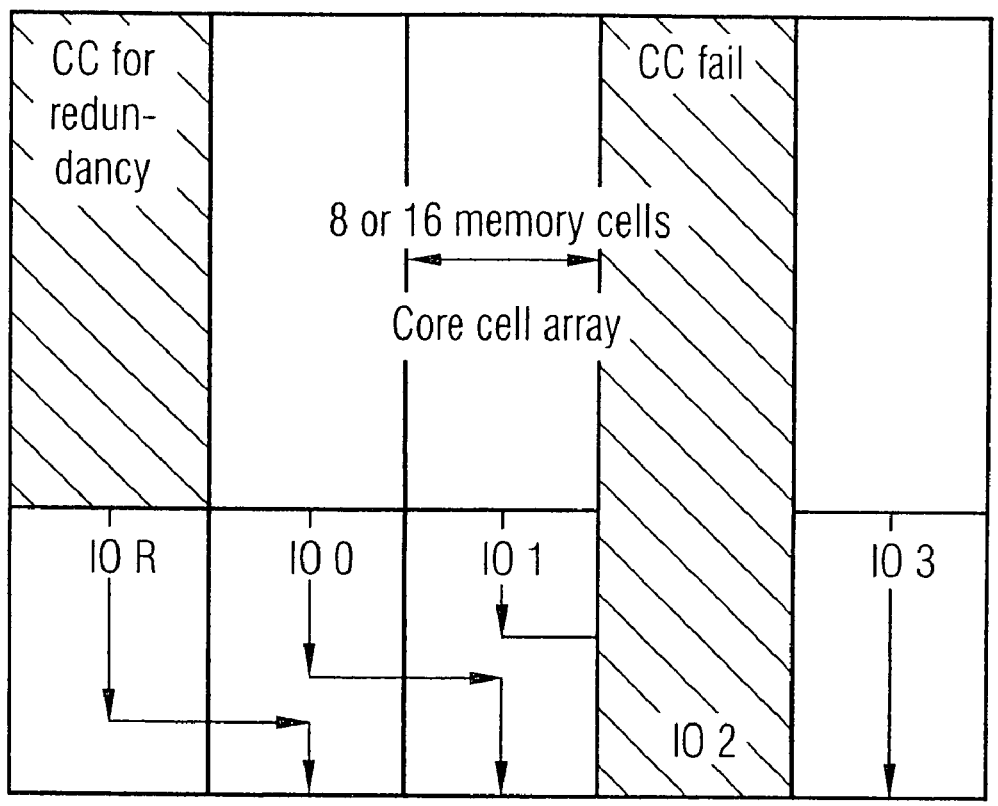
FIG. 8 shows a block diagram for explaining the repair mechanisms as described in EP 02022312.

The advantage of the Sub-Column-Repair-Circuit 1 as shown in FIG. 9 resides in that only a redundant memory subcolumn comprising four bitlines has to be provided to repair a faulty bitline BL within the memory cell array. Consequently chip area is saved in comparison to the structure as shown in FIG. 7.

Figure 10:
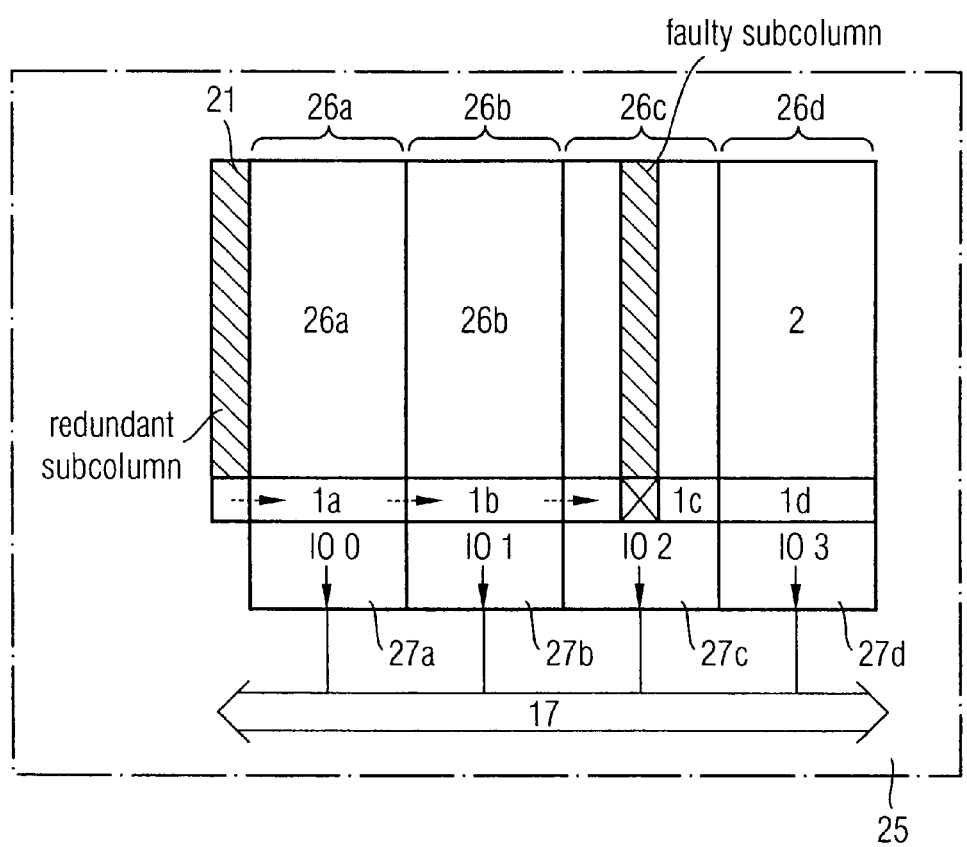
FIG. 10 shows a block diagram for explaining the functionality of the Sub-Column-Repair-Circuit according to the present invention.

FIG. 10 shows a block diagram of a memory chip 25 according to the present invention. The memory chip 25 comprises a memory cell array 26 having four memory columns 26a, 26b, 26c, 26d. To repair a faulty memory subcolumn the memory cell array 26 further comprises a redundant memory subcolumn 21. For each memory column 26a, 26b, 26c, 26d a corresponding Sub-Column-Repair-Circuit 1 according to the present invention is provided. In the memory chip 25 as shown in FIG. 10 four subcolumn memory circuits 1a, 1b, 1c, 1d are provided. Each Sub-Column-Repair-Circuit 1 is connecting to a corresponding input/output unit 27a, 27b, 27c, 27d including an output data buffer 15 and a data pad 16 as shown in FIG. 9. The input/output units 27a to 27d are connected to the databus 17. In case that a sub memory column having four bitlines is faulty within the third memory subcolumn 26c as shown in FIG. 10 the fusebox 20 is programmed in such a manner that the redundant memory sub column 21 replaces this faulty memory subcolumn within the third memory column 26c. The provided redundancy is comparatively low but sufficient for repairing bitline failures reliably. The memory chip 25 as shown in FIG. 10 is in a preferred embodiment a SRAM-memory. The bitline failure located in the memory subcolumn is replaced with a shift mechanism. The faulty memory subcolumn is switched off and replaced by the neighboring subcolumn until the redundant memory subcolumn 21 is reached.

Figure 11:
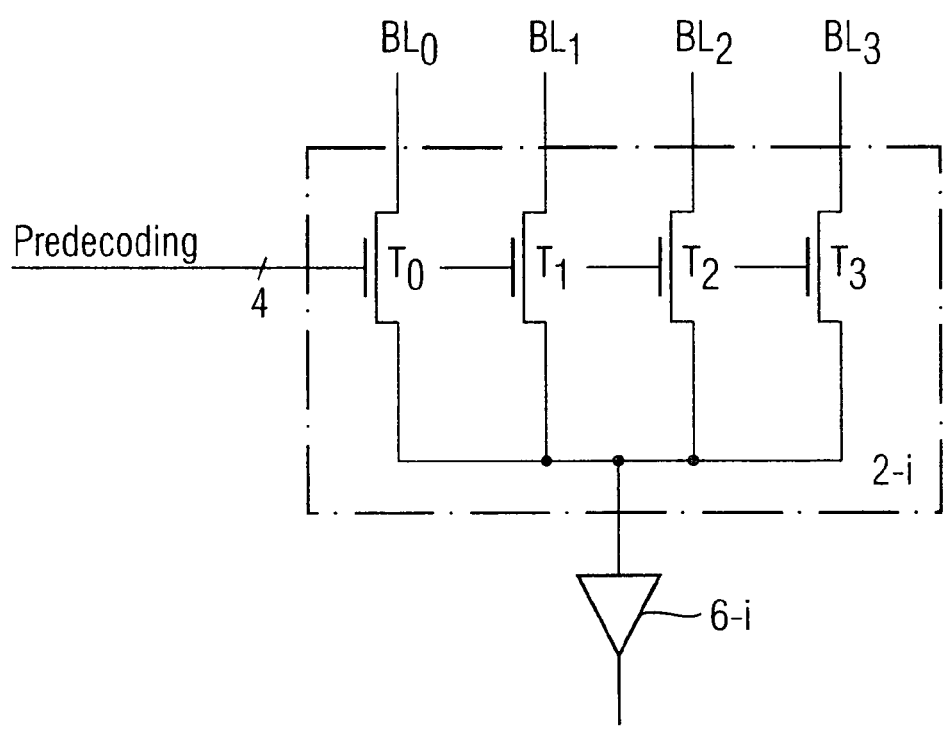
FIG. 11 shows the structure of multiplexer of a first multiplexer stage according to the present invention.

FIG. 11 shows a preferred embodiment of a multiplexer 2-i of the first multiplexer stage 2 within the Sub-Column-Repair-Circuit 1-i shown in FIG. 9. The gates of the MOS-transistors $T_0$–$T_3$ are controlled by the predecoding signal generated by the column decoder 4. In response to the predecoding signal one of the four bitlines $BL_0$–$BL_3$ of a memory subcolumn is switched through to the responding sense amplifier 6-i. When for instance bitline $BL_0$ is read, transistor To is on and the remaining transistors $T_1$, $T_2$, $T_3$ are off the capacitance at the input node of the sense amplifier 6-i is:

$$C_A = C_{IN} + C_{T1\ OFF} + C_{T2\ OFF} + C_{T3\ OFF}$$

wherein $C_{IN}$ is the input capacitance of the sense amplifier.

Accordingly the capacitance of the input side of the sense amplifier is:

$$C_A = C_{IN} + C_{T\ OFF} = C_{IN} + \sum_1^n C_{Ti\ OFF}$$

wherein n is the number of switched off MOS-transistors.

Instead of using one multiplexer having 16 inputs the Sub-Column-Repair-Circuit 1-i as shown in FIG. 9 is built in two stages wherein each multiplexer of the first multiplexer stage 2 has only four input terminals connected to bitlines $BL_0$ to $BL_3$. This has the advantage that the capacitance of the switched off transistors $T_i$ is comparatively low so that the speed of the multiplexer 2-i is increased.

Figure 12:
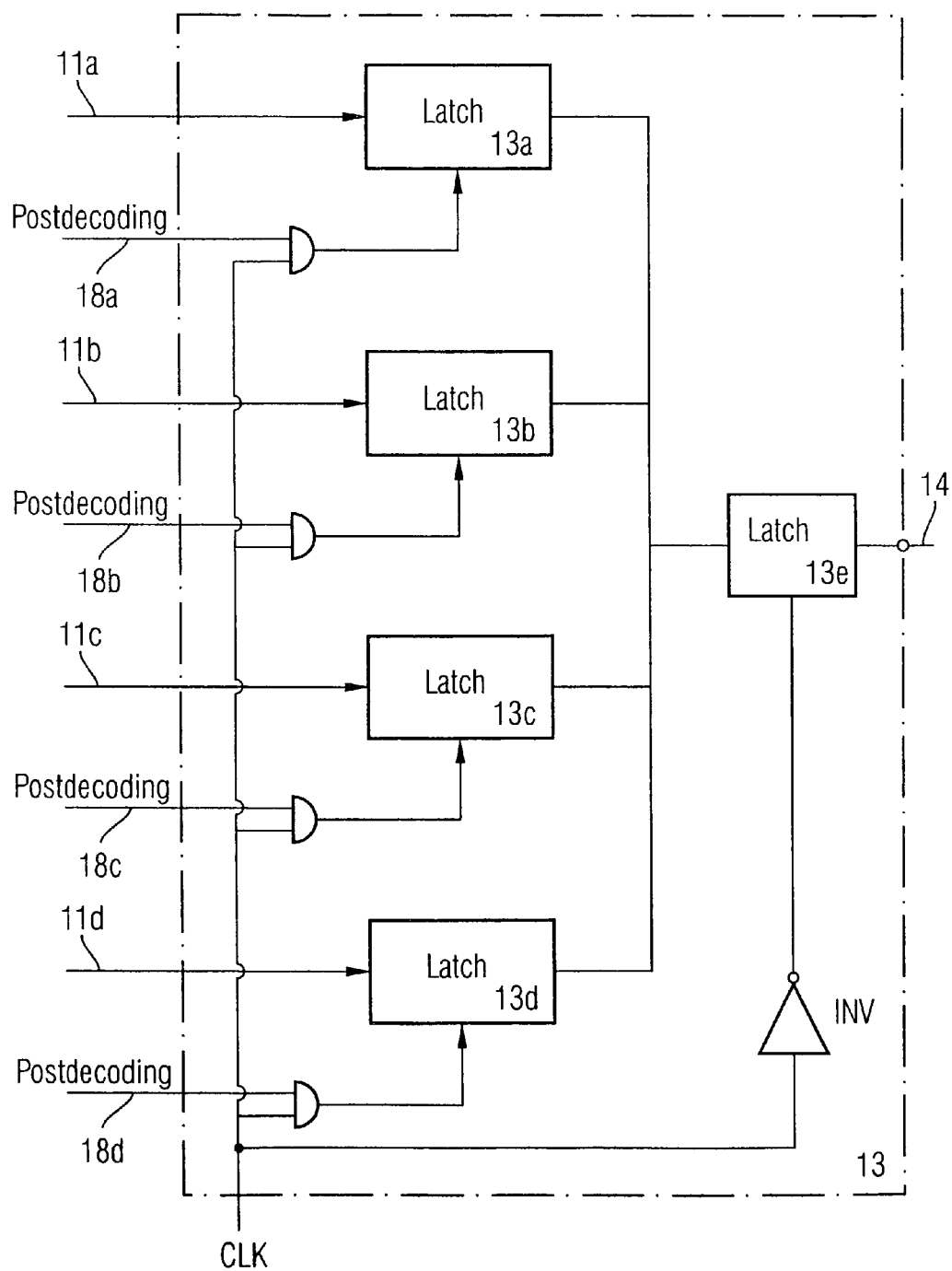
FIG. 12 shows the structure of multiplexer of a second multiplexer stage of the present invention.

FIG. 12 shows a preferred embodiment of the multiplexer 13 within the Sub-Column-Repair-Circuit 1-i as shown in FIG. 9. The multiplexer 13 comprises circuits 13a, 13b, 13c, 13d with the output terminals connected to a further latch circuit 13e. The data input of each latch circuit 13a to 13d is connected via line 11a to 11d with the output of corresponding mulitplexer 9a to 9d of the shift stage. The latch circuits 13a to 13d have a clock input which is connected to a corresponding and gate logically combining the postdecoding signal supplied via control line 18 with the clock signal CLK. Latch circuit 13e is connected with the output terminals of latch circuits 13a to 13d and has a clock input which receives the clock signal inverted by an inverter circuit INV. The output terminal of latch circuit 13e is connected via line 14 of the output data puffer 15.

LIST OF REFERENCE NUMBERS 1 sub-column-repair-circuit
2 first multiplexer stage
3 predecoding control line
4 column decoder
5 y-adress lines
6 sense amplifiers
7 data lines
8 multiplexer input
9 multiplexer
10 multiplexer input
11 line
12 multiplexer input
13 third multiplexer stage
14 output line
15 output data buffer
16 output data pad
17 data bus
18 postdecoding control line
19 fuse data control line
20 fusebox
21 redundant memory subcolumn
22 multiplexer
23 sense amplifier
24 data line
25 memory chip
26 memory subcolumns
27 input/output units

The invention claimed is:

1. An arrangement for repairing at least one faulty bit line of a memory, said memory having a plurality of columns, each column having k memory subcolumns, each memory subcolumn having n bit lines, the arrangement comprising:
   a) a first multiplexer stage, having k multiplexers, each multiplexer having a multiplexer output and n multiplexer inputs connected to n bitlines of a memory subcolumn, the multiplexers of the first multiplexer stage being switched in response to a first address decoding signal;
   b) a second multiplexer stage having k multiplexers, each multiplexer of the second multiplexer stage having a first multiplexer input connected to an multiplexer output of a multiplexer of the first multiplexer stage associated with a first memory subcolumn, a second multiplexer input connected to a multiplexer output of a multiplexer of the first multiplexer stage belonging associated with a second memory subcolumn, and a multiplexer output, the multiplexers of the second multiplexer stage being switched in response to a fuse data signal;
   c) a third multiplexer stage including at least one multiplexer having k multiplexer inputs connected to the multiplexer outputs of the multiplexers of the second multiplexer stage and one multiplexer output operably connected to a data bus of the memory, the multiplexer of the third multiplexer stage being switched in response to a second address decoding signal.

2. The arrangement of claim 1, further comprising a sense amplifier stage having k sense amplifiers.

3. The arrangement of claim 2, wherein each sense amplifier is operably coupled to amplify an output signal of a multiplexer of the first multiplexer stage.

4. The arrangement of claim 1, wherein the first address decoding signal and the second address decoding signal are generated by a column-decoder which decodes an applied y-address signal.

5. The arrangement of claim 1, wherein the fuse data signal is received from a fuse circuit that includes programmable fuses.

6. The arrangement of claim 1, further comprising an output data buffer operably connected to the multiplexer output of the multiplexer of the third multiplexer stage.

7. The arrangement of claim 1, wherein the bitlines comprise differential signal lines.

8. The arrangement of claim 2, wherein the k sense amplifiers comprise differential sense amplifiers.

9. A memory chip comprising:
   a) a memory cell array having a plurality of memory columns, each including a plurality of memory subcolumns and at least one redundant memory subcolumn, each memory sub-columns including a plurality of bitlines; and
   b) a plurality of repair circuits including a plurality of multiplexers associated with each column, a first multiplexer including a first input connected to receive data from a select bitline from a memory subcolumn associated with the multiplexer and a second input connected to at least one redundant memory subcolumn, the first multiplexer further including an output connected to a column multiplexer, the column multiplexer operable to provide column output data corresponding to a select one of the plurality of memory subcolumns of the column.

10. The memory chip of claim 9, further comprising a column decoder operable to receive an address identifying a bitline within one or more columns, and generate address decoding signals therefrom.

11. The memory chip of claim 10, wherein the column decoder is operable to provide a first decoding signal corresponding to the select bitline within the selected memory subcolumn, and to provide a second decoding signal to the column multiplexer corresponding to the selected memory subcolumn.

12. The memory chip of claim 11, further comprising a sub-column multiplexer associated with each subcolumn, a first subcolumn multiplexer operable to couple the selected bitline from the plurality of bitlines of the first subcolumn to the first input of the first multiplexer.

13. The memory chip of claim 9, further comprising a subcolumn multiplexer associated with each subcolumn, a first subcolumn multiplexer operable to couple the selected bitline from the plurality of bitlines of the subcolumn to the first input of the first multiplexer.

14. The memory chip of claim 9, further comprising a second multiplexer having a first input connected to receive data from one of a plurality of bitlines of a first memory subcolumn and a second input connected to receive data from one of plurality of bitlines of a second memory subcolumn, the second multiplexer having an output operably connected to the column multiplexer.

15. An arrangement for repairing at least on faulty bit line of a memory, said memory having a plurality of columns, each column having k memory subcolumns, each memory subcolumn having n bit lines, the arrangement comprising:
   a plurality of switching elements associated with a column, each switching element associated with a memory subcolumn of the column, each switching element including a first input connected to receive data from a select bitline of a first memory subcolumn and a second input connected to receive data from a select bitline of a second memory subcolumn, each switching element further including an output connected to a column multiplexer, the column multiplexer operable to provide column output data corresponding to a select one of the k memory subcolumns of the column.

16. The arrangement of claim 15 wherein the each switching element is operably coupled to receive a control signal, each switching element operable to selectively couple the first input or the second input to the column multiplexer responsive to the control signal, the control signal generated based on self-test information of the memory.

17. The arrangement of claim 15 wherein the switching elements comprise multiplexers.

18. The arrangement of claim 15, further comprising a column decoder operable to receive an address identifying a bitline within one or more columns, and generate address decoding signals therefrom.

19. The arrangement of claim 18, wherein the column decoder is operable to provide a first decoding signal corresponding to the select bitline within the selected memory subcolumn, and to provide a second decoding signal to the column multiplexer corresponding to the selected memory subcolumn.

20. The arrangement of claim 19, further comprising a subcolumn multiplexer associated with each subcolumn, each subcolumn multiplexer operable to couple the selected bitline from the plurality of bitlines of the subcolumn to the first input of the switching element.

* * * * *